(12) United States Patent
Sichmann et al.

(10) Patent No.: US 9,451,712 B2
(45) Date of Patent: Sep. 20, 2016

(54) SERIES MODULE ARRANGEMENT WITH AN ENERGY BUS SYSTEM

(71) Applicant: WEIDMÜLLER INTERFACE GMBH & CO. KG, Detmold (DE)

(72) Inventors: Wolfgang Sichmann, Huttenberg (DE); Bernd Van Giesen, Detmold (DE); Stefan Aporius, Detmold (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 42 days.

(21) Appl. No.: 14/435,934

(22) PCT Filed: Oct. 24, 2013

(86) PCT No.: PCT/EP2013/072298
§ 371 (c)(1),
(2) Date: Apr. 15, 2015

(87) PCT Pub. No.: WO2014/067849
PCT Pub. Date: May 8, 2014

(65) Prior Publication Data
US 2015/0257286 A1   Sep. 10, 2015

(30) Foreign Application Priority Data

Oct. 30, 2012 (DE) .................... 20 2012 104 159 U
May 28, 2013 (DE) .................... 20 2013 102 303 U

(51) Int. Cl.
*H05K 5/00* (2006.01)
*H01R 4/48* (2006.01)
(Continued)

(52) U.S. Cl.
CPC .......... *H05K 5/0065* (2013.01); *H01R 4/4809* (2013.01); *H01R 9/2458* (2013.01); *H05K 5/0221* (2013.01); *H05K 5/0291* (2013.01)

(58) Field of Classification Search
USPC ................ 361/728–732, 727, 752, 796, 800;
312/223.1–223.2; 439/55, 78, 83, 108, 439/122, 189, 213, 263, 264, 387, 389, 391, 439/395, 625, 626, 629, 660, 676
See application file for complete search history.

(56) References Cited

U.S. PATENT DOCUMENTS 4,472,764 A * 9/1984 Richard ............... H01R 9/2625
                                                361/775
7,714,237 B2 * 5/2010 Fabrizi ...................... H02G 3/18
                                                174/563

(Continued)

FOREIGN PATENT DOCUMENTS

DE          44 02 001 A1   7/1995
DE   10 2005 008 899 A1   8/2006
(Continued)

*Primary Examiner* — Hung S Bui
(74) *Attorney, Agent, or Firm* — Lawrence E. Laubscher, Sr.; Lawrence E. Laubscher, Jr.; Robert D. Spendlove

(57) ABSTRACT

An electrical module arrangement for supplying electrical power to a printed circuit board mounted within the housing of an electrical module, including a plug-in electrical connector mounted in an opening contained in an end wall of the module housing. The connector is of the conductive leaf spring S-shaped type, including two reversely-bent portions defining oppositely directed recesses for receiving a bus bar voltage source and a planar contact of the printed circuit board, respectively. In a modification, the leaf spring is W-shaped including three bends, thereby permitting connection of the PCB contact with two separate parallel spaced bus bar arrangements. A plurality of the modules are supported in side-by-side relation either by mounting the module housings on a common mounting rail, or by connecting the plug-in connectors to a common bus bar mounted on a fixed support.

14 Claims, 11 Drawing Sheets

(51) Int. Cl.
*H01R 9/24* (2006.01)
*H05K 5/02* (2006.01)

(56) References Cited

U.S. PATENT DOCUMENTS

| | | | | |
|---|---|---|---|---|
| 8,564,964 B2* | 10/2013 | Nakashima | .......... | H01R 9/2466 361/611 |
| 8,764,464 B2* | 7/2014 | Buck | .................... | H01R 13/514 439/108 |
| 2003/0143881 A1* | 7/2003 | Ferranti | ................ | H01R 13/518 439/213 |
| 2016/0164235 A1* | 6/2016 | Aporius | ............. | H01R 12/7088 439/122 |

FOREIGN PATENT DOCUMENTS

| | | |
|---|---|---|
| DE | 10 2006 025 604 A1 | 11/2007 |
| DE | 10 2011 001 152 A1 | 9/2012 |

* cited by examiner

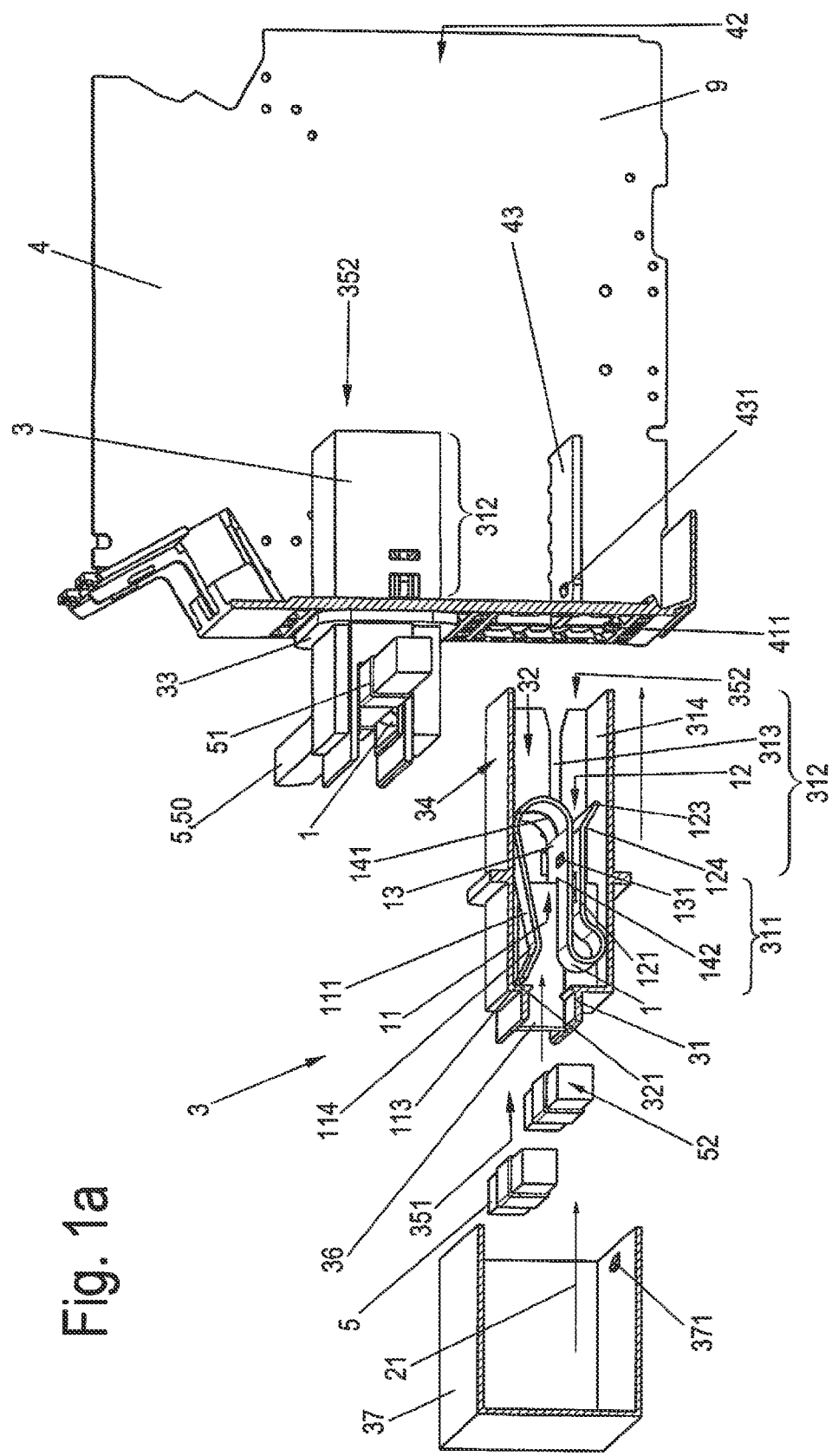

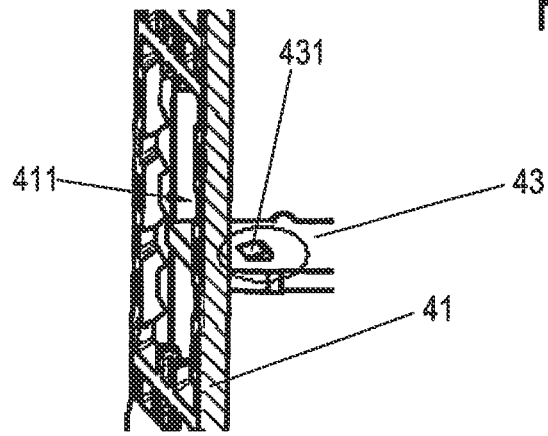
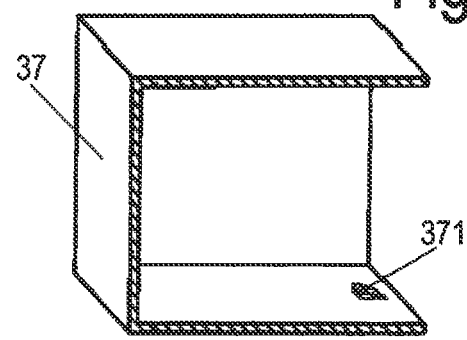
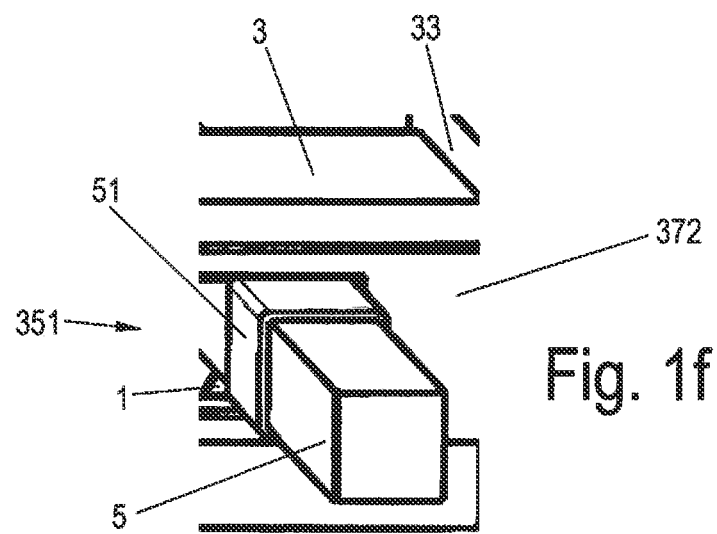

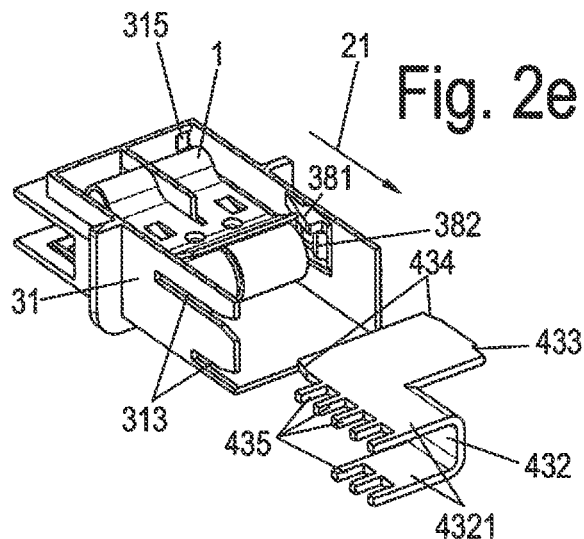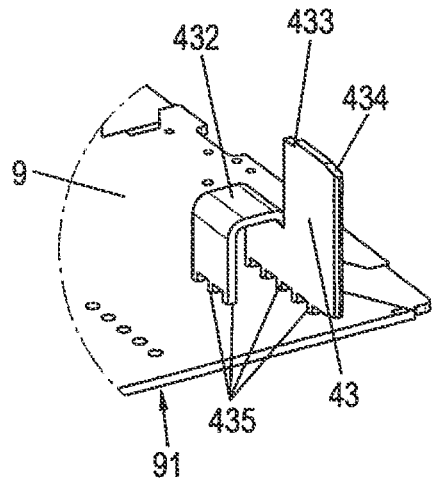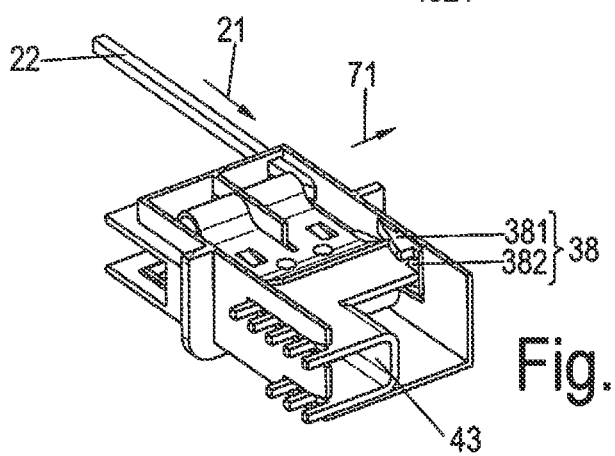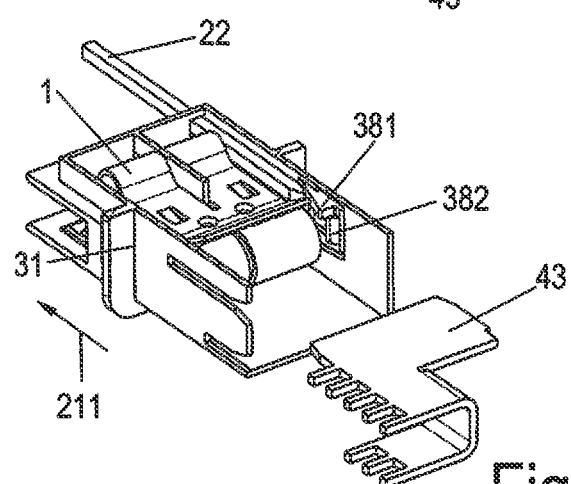

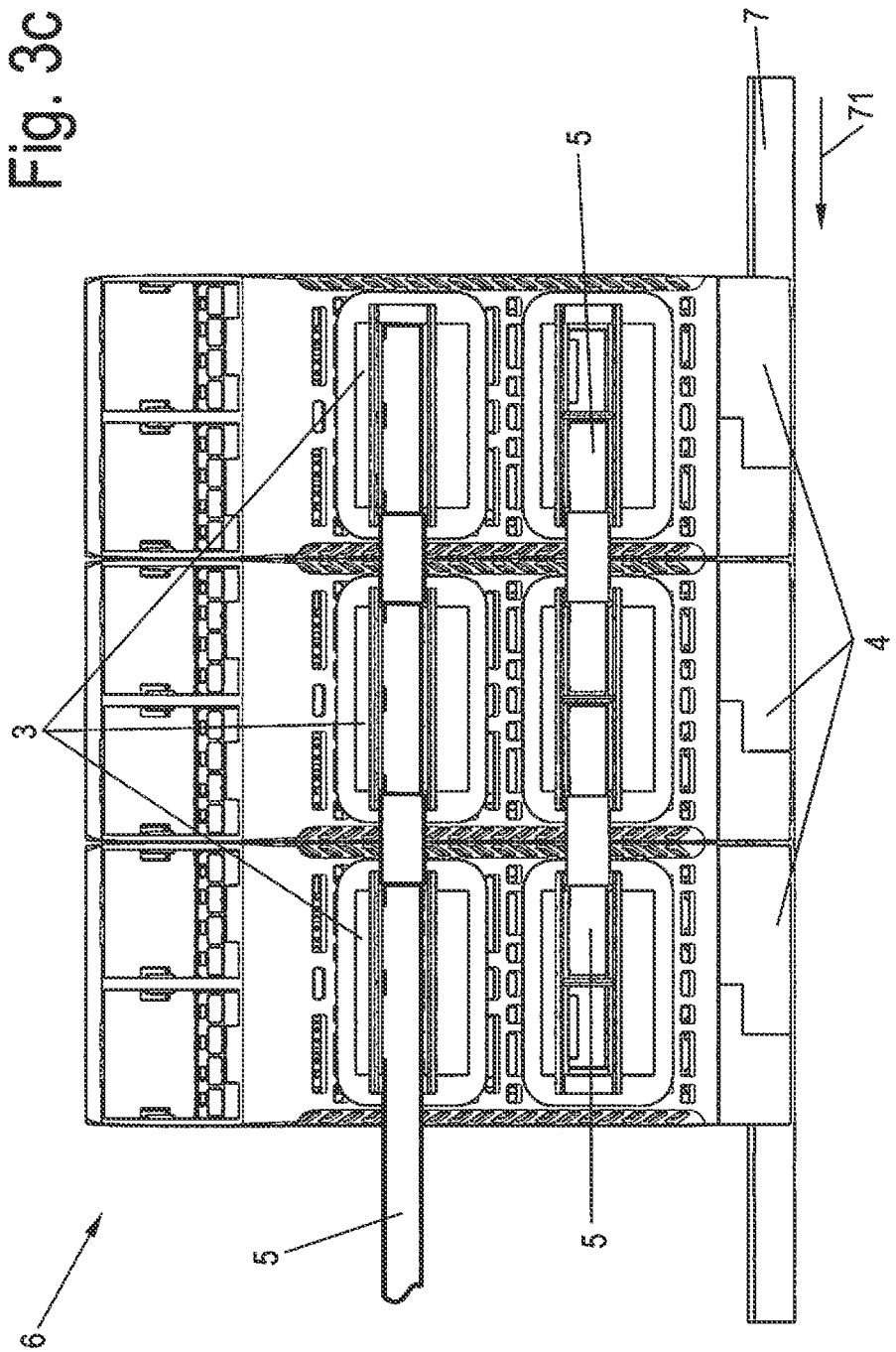

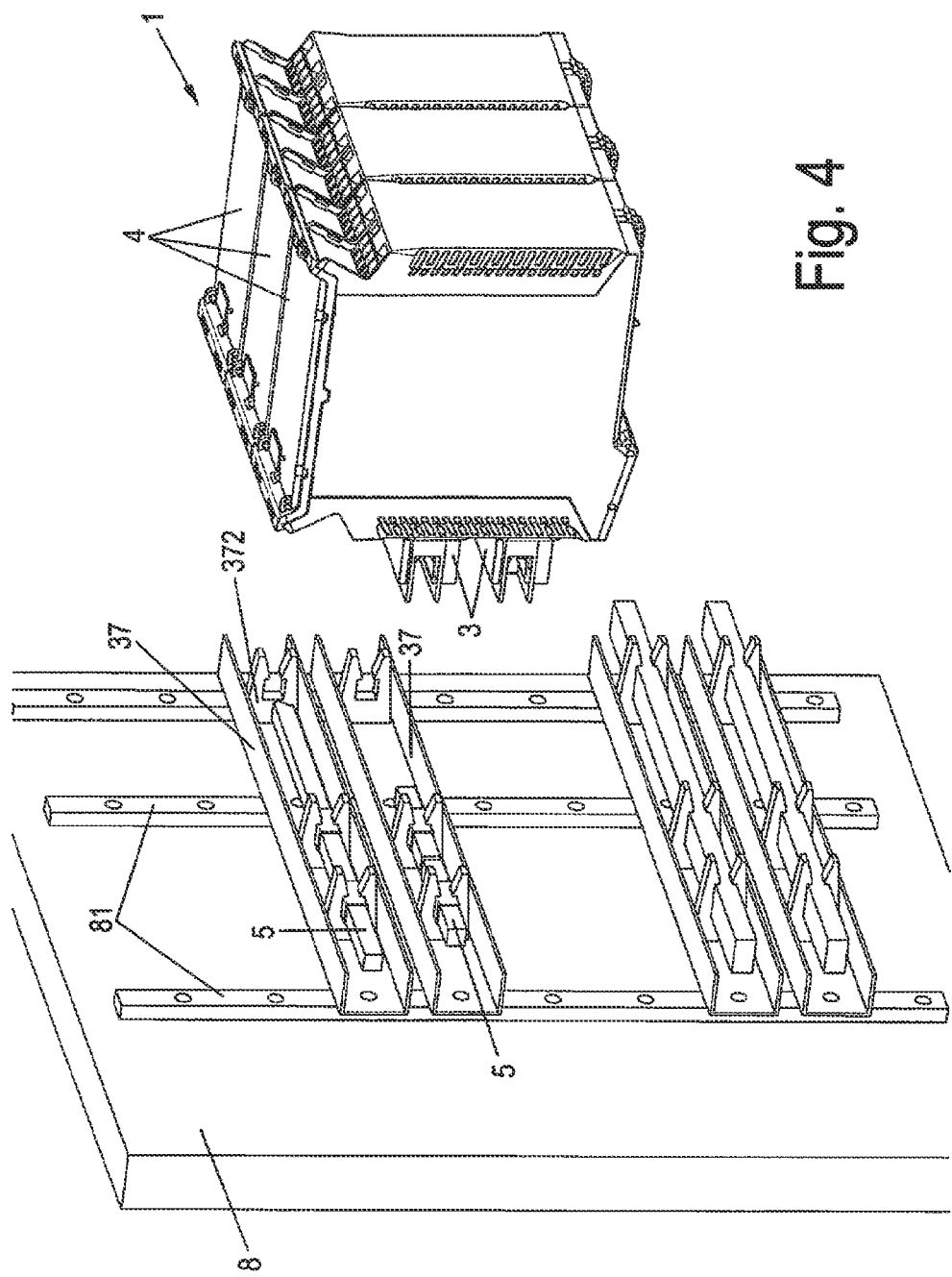

SERIES MODULE ARRANGEMENT WITH AN ENERGY BUS SYSTEM

REFERENCE TO RELATED APPLICATIONS

This application is a national stage application under 35 C.F.R. §371 of the PCT International Application No. PCT/EP2013/072298 filed Oct. 24, 2013, which claims priority of the German application No. DE 20 2012 104 159.6 filed Oct. 30, 2012.

BACKGROUND OF THE INVENTION

1. Field of the Invention

An electrical module arrangement for supplying electrical power to a printed circuit board mounted within the housing of an electrical module, including a plug-in electrical connector mounted in an opening contained in an end wall of the module housing. The connector is of the conductive leaf spring S-shaped type, including two reversely-bent portions defining oppositely directed recesses for receiving a bus bar voltage source and a planar contact of the printed circuit board, respectively.

2. Description of Related Art

It is known in the prior art to provide bus bar systems for supplying electrical energy to components mounted on printed circuit boards. An electrical component is any electrical device that is capable of being attached to such a bus system. Primarily included in these are electrical devices that ensure the electrical supply, for example network devices and network filters, especially for frequency converters and servo-controllers. Such bus systems are advantageously placed external to the electrical components, to facilitate access to the bus system, and to make possible a tapping of the electrical supply and electrical signals at any arbitrary location of the bus system to the extent possible.

One electrical module with a bus system placed externally is shown, for example, in the German publication DE 20 2011 000 855 U.

The present invention takes up the task of providing a plug-in arrangement for attachment of such a bus system designed to be external, which makes possible an optimally simple tapping of the electrical supply and electrical signals, and thus quick installation, which is suitable for power currents, which is able to be used in modular fashion and can be manufactured in cost-effective fashion. Additionally to be provided is a contact element as advantageous as possible for such an arrangement.

SUMMARY OF THE INVENTION

Accordingly, a primary object of the invention is to provide an electrical module arrangement for supplying electrical power to a printed circuit board mounted within the housing of an electrical module, including a plug-in electrical connector mounted in an opening contained in an end wall of the module housing. The connector is of the conductive leaf spring S-shaped type, including two reversely-bent portions defining oppositely directed recesses for receiving a bus bar voltage source and a planar contact of the printed circuit board, respectively. In a modification, the leaf spring is W-shaped including three bends, thereby permitting connection of the PCB contact with two separate parallel spaced bus bar arrangements.

According to another object, a plurality of the modules are supported in side-by-side relation either by mounting the module housings on a common mounting rail, or by connecting the plug-in connectors to a common bus bar mounted on a fixed support.

One such electrical module arrangement preferably comprises a bus system which is suitable for power currents, as well as electrical modules which are situated to be arranged in rows one on another on an assembled base, especially a mounting rail or a bus bar on a wall. Each electrical module exhibits an electronic housing in which at least one printed circuit board is placed. It is preferred that the printed circuit board comprises electronic components so that it forms an electrical assembly.

The bus system, which is also designated hereinafter as an energy bus system, is designed to be exterior to the electronic housing, to make possible quicker access and to facilitate assembly. Preferably it comprises at least one or more bus bars, which in regard to their cross section, their diameter and the material used, are adaptable to meet the requirements for the power to be transmitted.

By connecting the electrical modules to the power rail, it is possible to make a very rapid and secure connection of the electrical modules with the bus signal passed on this power rail, and with the power transmitted on this power rail.

Preferably a power rail is electrically connected via a plug-in arrangement with the printed circuit board of an electrical module. With this, the plug-in arrangement preferably exhibits a housing with an interior space in which a friction spring is placed, which is electrically connected with the printed circuit board. The bus bar is preferably able to be fit in replaceable fashion into the plug-in arrangement, wherein the power rail fitted into the plug-in arrangement make electrical contact with the friction spring. To make access possible in the interior space of the plug-in arrangement, it has front sides extending perpendicular to its long side, which at least in part are configured to be open.

The contact to the printed circuit board is preferably made by means of a contact device which is designed to be plate-shaped, especially as a contact plate. Also possible as a contact device is a printed circuit board, equipped or not equipped with electrical components.

Preferably the contact device is placed in the interior of the electrical module, and preferably it extends in the long direction of the plug-in arrangement, and transverse to the lining-up direction. Preferably it is attached to the printed circuit board of the electrical module, and—especially preferred—is soldered to it.

To make access possible to the contact device, preferably the electronic housing exhibits a recess. Via the recess, the plug-in arrangement can be inserted into the inner space of the electronic housing.

In its configuration as a contact plate, it is preferred that is have soldering lugs, which can be inserted through recesses in the printed circuit board, so that they can be soldered onto it on a rear side of the printed circuit board. To increase the current carrying capacity as well as the stability of the contact device, in another embodiment form it is preferred that the contact device exhibit a support bend with two legs placed opposite, provided on each of their open ends with soldering lugs for soldering with the printed circuit board. By this means, more soldering lugs can be provided on the contact device. Additionally, the support bend not only increases the stability of the contact device itself, but also the stability when fitting or soldering the plug-in arrangement onto or from the contact device.

The one plug-in arrangement with this arrangement is preferably configured so that it can be inserted in a fitting direction onto the contact device. With this, it is preferred that the fitting direction be the longitudinal direction of the plug-in arrangement. In especially preferred fashion, the contact device extends transverse to the printed circuit board. In addition, with this it preferred that the printed circuit board extend in the lining-up direction, or transverse to it, preferably parallel to a wall of the electronic housing. It is especially preferred that the printed circuit board be electrically insulated as it is attached to the housing wall.

Additionally it is preferred that the bus bar extend in the lining-up direction, and be able to be inserted removably into the resilient leaf spring. For this, the leaf spring preferably exhibits two contact areas, with the first contact area provided to admit the bus bar and the second contact rail provided to admit the contact device. The contact devices preferably are configured as tulips. In especially preferred fashion, the leaf spring is configured as a double tulip, and, especially preferred, is S-shaped. In this embodiment form, it exhibits a first S-bend to admit the bus bar, as well as a second S-bend to admit the contact device. Hereinafter the terms contact area and S-bend are used synonymously.

The first S bend and the second S bend preferably exhibit a common central flange and an outer flange. In one preferred embodiment form, an interval of an outer flange from the central flange of the first S bend is larger than the interval of the outer flange from the central flange of the second S bend. In addition it is preferred that the outer flange of the second S bend runs at least in part parallel to the central flange. However, it is also preferred that the outer flange be situated at an angle to the second S bend, which permits an opening for fitting the second S bend onto the contact device.

Due to heightened stability when the plug-in arrangement is being inserted into or loosened from the contact device, the configuration of the contact device as a contact plate with support bends has an advantage in that a greater contact force of the second S bend can be implemented.

The S-shaped leaf spring is very simple to install, can be manufactured from a planar material in cost-effective fashion as a punched bending component with very little waste, and it ensures a very secure electrical contact to the contact device, which is inserted into one of the two S-bend pairs. Preferably the leaf spring is manufactured from a metal or a metallic alloy, especially a spring steel. Here also, manufacture is possible from a better-conducting material, such as copper or a copper alloy. Depending on the requirements for current carrying capacity of the leaf springs, along with the material used, the thickness of the flat material and the width of one of the pair of leaf springs can be varied. Depending on the clamping forces required, in addition it is possible to use an auxiliary over spring.

It is preferred that the outer flange of the second S bend as well as the central flange, extend in the long direction. The outer flange of the first S bend preferably extends at least essentially in the long direction. In contrast, the connections between the outer flanges and the center flange exhibit an extension component transverse to the long direction, and preferably are shaped as bends.

When inserting the plug-in arrangement, the contact device preferably is inserted between the center flange and the outer flange of the second S bend. Additionally, on the center flange and/or on the outer flange, preferably a locking device is provided, for example a recess or an integral element, wherein, on the contact device, a corresponding counter-locking device is provided, with them locking with each other when the contact device is inserted into the second S bend. It is especially preferred that the contact device extends in the long direction, so that it is very easy to insert the clamping means or insert the electrical assembly into the second S bend.

As an alternative, or in addition, it is conceivable that an attachment device be provided on the housing of the plug-in device, which acts in concert with a counter-attachment device on the contact device. In one preferred embodiment form, the attachment device is a mechanical locking device, which makes possible secure locking of the contact device on the housing of the plug-in arrangement. In especially preferred fashion, the mechanical locking device can be removed by means of a tool, so that the plug-in arrangement is removable from the contact device by activating the mechanical locking device, especially with the tool, and removable from the electrical module.

Additionally, it is preferred that each of the outer flanges exhibits an open end, wherein the outer flange of the first S bend and/or the outer flange of the second S bend exhibit a bend directed outward on the open end. Preferably the bending of the first S bend is provided so that it secures a bus bar inserted into the first S bend from falling out. Additionally, the bends of the first and/or second S bends are preferably to be so provided, that they aid installation of the bus bars into the first S bend, or of the contact plate into the second S bend, respectively.

The leaf spring preferably is able to be pre-mounted in the interior space of the plug-in arrangement. Therefore, such a plug-in device can be manufactured in modular fashion, and be an aid for cost-effective inventory storage and assembly.

Preferably the housing of the plug-in arrangement has roughly the shape of a rectangular tube. The S-bends of the leaf springs are accessible from without, via the front sides of the housing, which are aligned in the long direction, and configured to be at least partially open. In the area of the first S bend, in addition, preferably the housing is open on opposite sides, so that a bus bar can be inserted into the first S bend, transverse to the longitudinal direction. Additionally it is preferred that the housing be manufactured from an electrically insulating material, especially a plastic. In this embodiment form, it can be manufactured in very cost effective fashion by means of a traditional method, for example as a shaped part.

To secure the leaf spring in the housing, in a preferred embodiment form it has attachment devices which act in concert with corresponding counter-attachment devices of the leaf spring. The attachment devices are preferably placed on one or more interior walls of the housing. In addition it is preferred that the plug-in arrangement in the interior space have a stop for the open end of the first S bend, for example an edge or a flange, so that the leaf spring cannot slip out of the housing.

Preferably the housing of the plug-in arrangement is provided so that it exhibits an exterior piece for placement outside the electronic housing of the electrical module, and an interior piece for placement inside the electronic housing. Therefore, its outer part projects out of the electronic housing. For this, between the exterior piece and the interior piece an exterior stop is provided, which adjoins on an outer side of the electronic housing.

It is preferred that the first S bend is accessible from the front side of the exterior piece. Since the exterior piece projects out of the electrical module, the bus bar is inserted from without into the leaf spring, and placed outside. With this, preferably it is inserted between the outer flange of the first S bend and the central flange. It is possible for a user to very quickly and easily insert the bus bar and remove it.

The stop provided in the interior space of the plug-in arrangement for the open end of the first S bend is preferably placed in the exterior part, and configured so that it prevents removal or dropout of the friction spring on the front side of the exterior piece.

Preferably the stop, the attachment devices and the exterior stop are formed in a single piece with the housing, and therefore require neither additional components nor expense for assembly.

In a preferred embodiment form, the outer flange of the first S bend as well as the outer flange of the second S bend, and at least a part of the central flange, each exhibit one or more slits running in the long direction. The at least one slit is preferably placed roughly centrally on the friction spring. In especially preferred fashion it is provided on the exterior part and makes it possible to subdivide the friction spring by at least one intermediate wall. Preferably the intermediate wall can be removed from the friction spring and makes possible an arrangement of busbars separated one from another.

Additionally, the plug-in arrangement comprises a housing bracket, which is removably situated on the external part. Preferably the bracket can be locked on the housing of the plug-in arrangement, for example by means of integral elements and recesses that correspond to each other. Preferably the bracket is made of an electrically insulating material such as a plastic, for example. By means of the bracket, the bus bar is additionally secured against falling out in the plug-in arrangement. In addition, with a plug-in arrangement that carries current, it increases safety for a user.

The housing brackets preferably are configured to be U-shaped, or exhibit only one side wall, which extends in the long direction and transverse to the lining-up direction. By this means, a bus bar connecting multiple electrical modules is able to be completely covered with one or more housing brackets placed in the lining-up direction.

Therefore, the electrical module arrangement comprises the electrical modules with at least one plug-in arrangement, wherein the plug-in arrangement is inserted into it from without, via a recess in the electronic housing of its electrical module. Preferably the plug-in arrangement is inserted into it from a front side of the electrical module in the long direction. After insertion, the exterior stop of the plug-in arrangement preferably adjoins the front side of the electrical module. It is especially preferred that the plug-in arrangement is clamped or locked when inserted into the recess. Some other attachment, for example screwing, is also possible, however.

Both the plug-in arrangement and the bus bar can be inserted into the electrical module or the electrical module arrangement, respectively, and therefore assembly and reconfiguration of the electrical module arrangement is especially quick and simple. The invention also provides apparatus that is especially easy-to-assemble and manipulate.

BRIEF DESCRIPTION OF THE DRAWINGS

Other objects and advantages of the invention will become apparent from a study of the following specification, when viewed in the light of the accompanying drawing, in which:

FIG. 1a is an exploded perspective view of a module including plug-in connector arrangements in accordance with the present invention, and FIGS. 1b-1f are detailed perspective views of certain components of FIG. 1a;

FIGS. 2d-2g are detailed perspective views of certain components of FIG. 2c;

FIG. 3c is a front elevation view of the apparatus of FIG. 3c;

FIG. 4 is an exploded view illustrating the connection of a plug-in module arrangement to bus bars mounted on a fixed wall surface;

FIG. 5a is an exploded view of a modification of the apparatus of FIG. 4; and FIG. 5b is a detailed perspective view of the circled portion of FIG. 5a.

DETAILED DESCRIPTION OF THE INVENTION

Figure 2A:
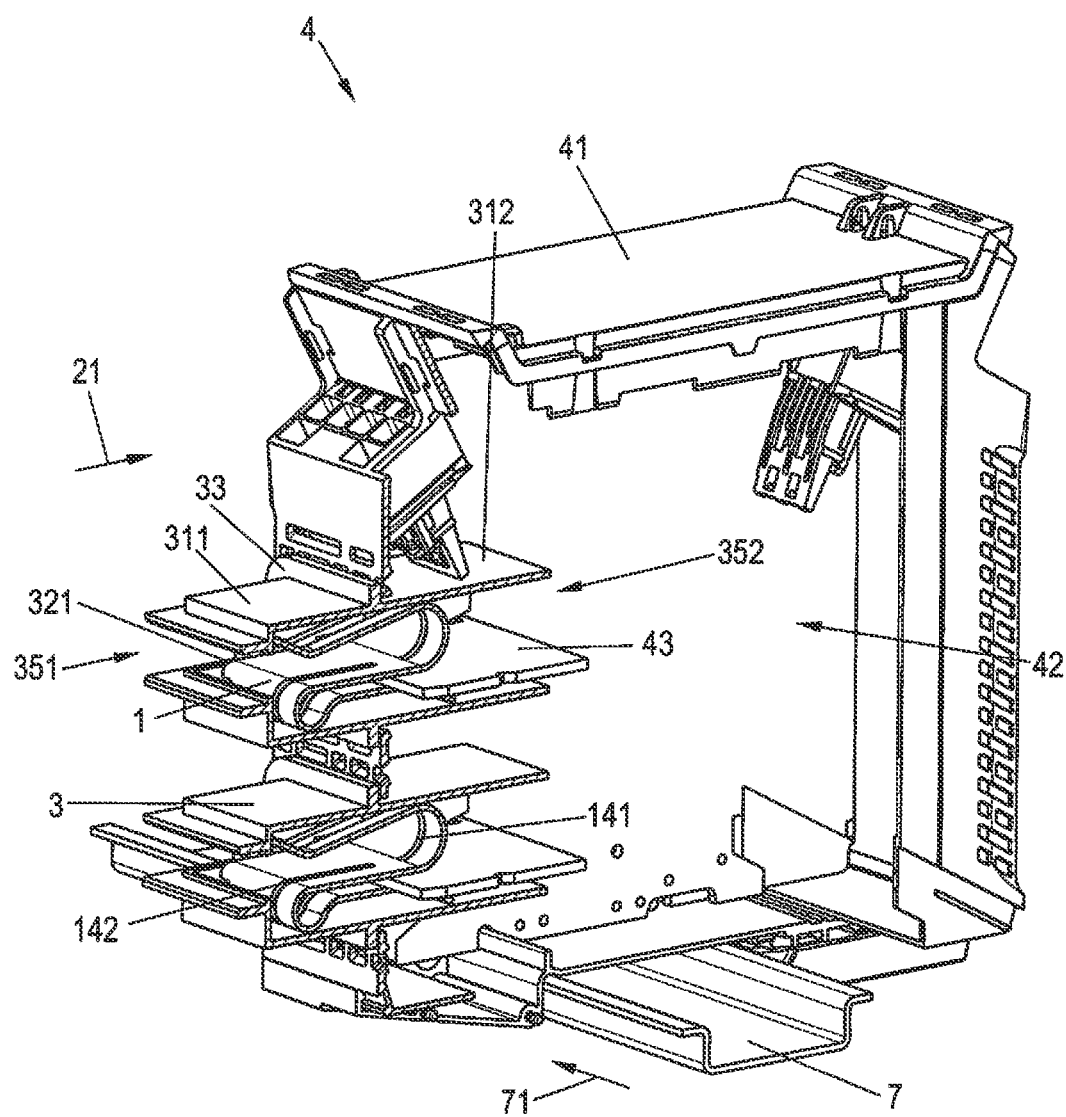
FIG. 2a is a perspective view, with certain parts removed for purposes of illustration, of an assembled module.
Figure 2B:
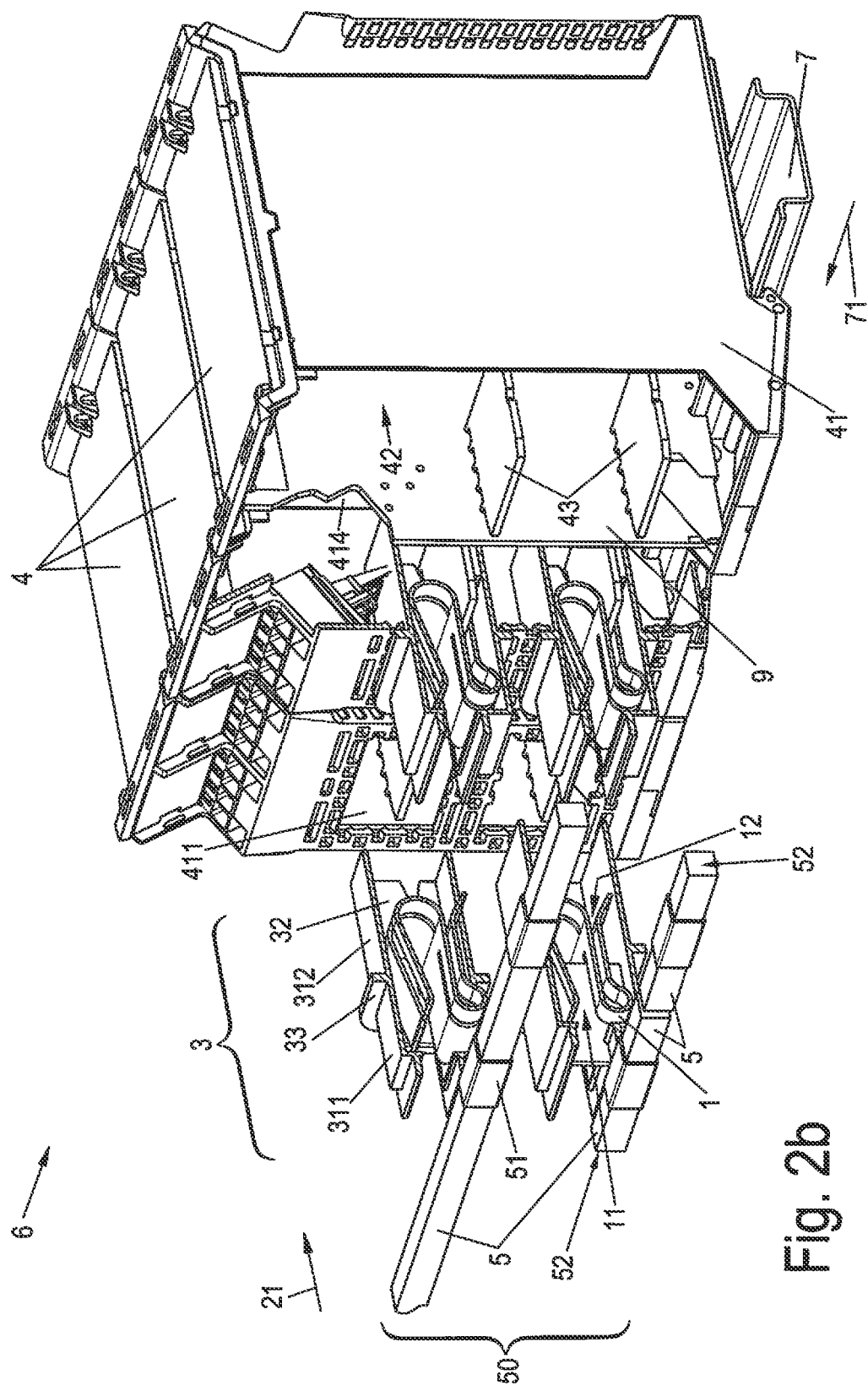
FIGS. 2b and 2c are perspective views illustrating the mounting of a plurality of modules on a mounting rail.

Referring first more particularly to FIG. 2b, an electrical module arrangement 6 is provided for use with a bus system 50, which comprises bus bars 5, wherein the electrical module arrangement 6 includes a plurality of modules 4 mounted side-by-side in a lining-up direction 71 on a mounting rail 7. The electrical modules 4 include an electronic housing 41 containing a chamber 42 in which at least one printed circuit board 9 is placed, here normal to the lining-up direction 71. In the electrical modules 4, multiple plug-in arrangements 3 are situated, each of which is provided to create an electrically conducting connection between a bus bar 5 of the bus system 50 and the printed circuit board 9 of electrical module 4.

Figure 1B:
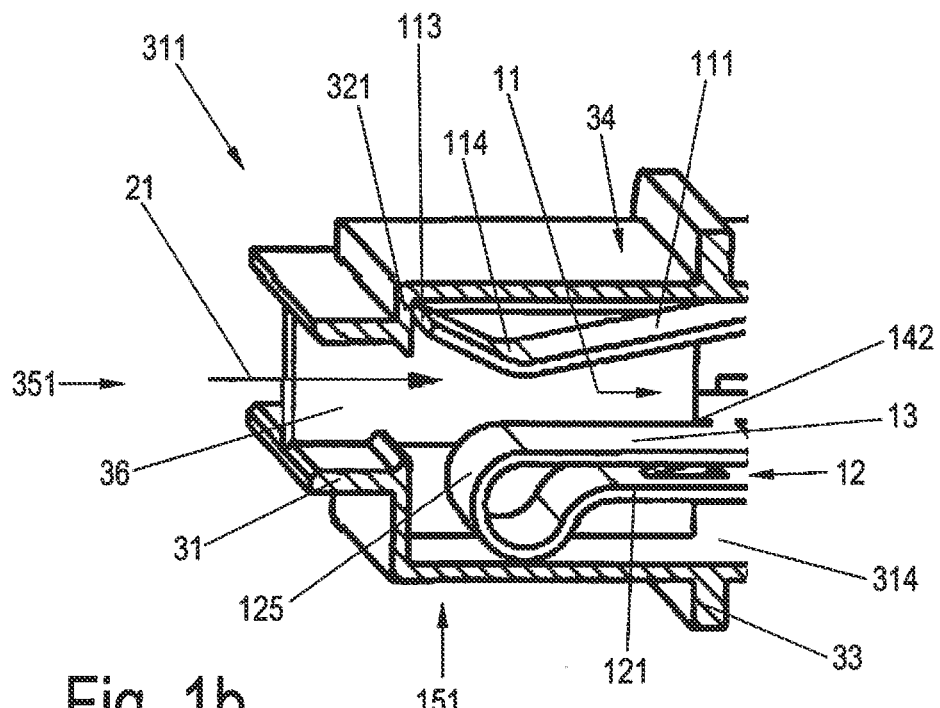

The exploded view of FIG. 1 shows insertion of the plug-in device 3 into a recess 411 of the electrical module 4, as well as a mounted, plug-in device 3 inserted into the electrical module 4, with a bus bar 5 placed on the exterior.

The plug-in arrangement 3 comprises a resilient leaf spring 1. Of the plug-in arrangement 3, a sectional view is shown, so that the friction spring 1 is visible. And of the electrical module 4, a part of the electronic housing 41 is depicted, so that both the plug-in arrangement 3 and the insertion of the plug-in arrangement 3 are visible. Preferably the electronic housing 41 is provided for row placement on the assembled base 7, for example the mounting rail 7.

The leaf spring 1 and the plug-in arrangement 3 extend in a longitudinal direction 21, which simultaneously is the insertion direction of the plug-in arrangement 3 into the electronic housing 41.

Figures 5A, 5B:
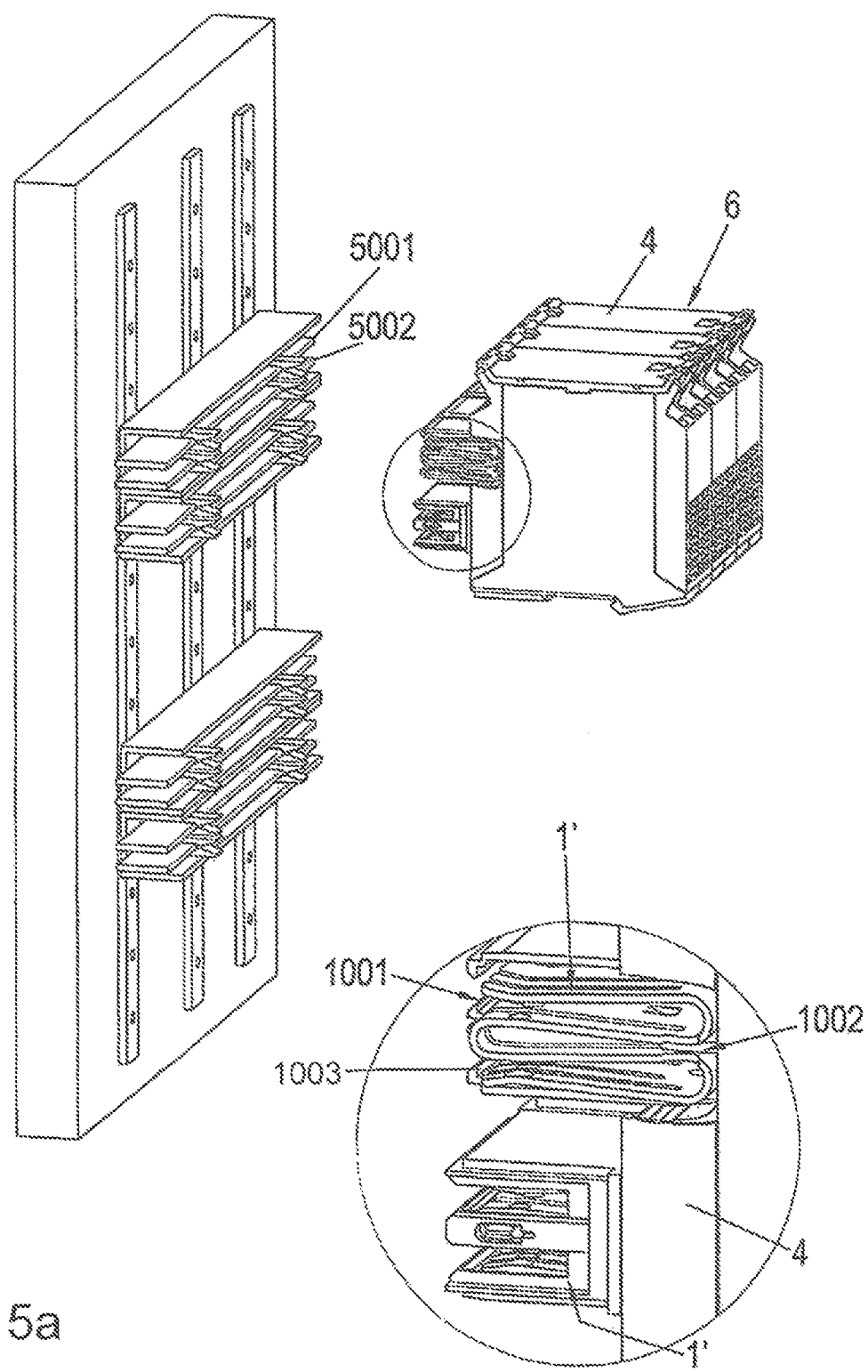

Here, the leaf spring exhibits two, and as per FIG. 5, three tulip-shaped contact areas 11, 12. The two contact areas 11, 12 are placed one over the other, so that the leaf spring 1 here is configured as an S-shaped tulip (W-shaped triple tulip in FIG. 5), wherein the double tulip exhibits as contact areas a first S bend 11 and a second S bend 12. In what follows, the terms first contact area 11 and first S bend, as well as second contact area 12 and second S bend, are used synonymously. The S bends 11, 12 exhibit a common central leg 13 and each has an outer leg 111, 121. The outer flanges 111, 121 each have a bend 113, 123 and an open end 114, 124. They are connected at opposite ends 151, 152 of the leaf spring 1 via a bend-shaped connection 115, 125 with the central flange 13.

The leaf spring 1 is placed in an interior space 32 of a housing 31 of the plug-in arrangement 3. The bent connections 115, 125 and the open ends 113, 123 of leaf spring 1 are provided so that they adjoin on interior walls 314 of the housing 31. By this means, the clamping spring 1 is positioned so that the central flange 13 and the outer flange 121 of the second S bend 12 extend at least partially in the longitudinal direction 21. By this means, the second S bend 12 is able to be inserted onto an electronic assembly 43 in the longitudinal direction 21, which is supported in an electrical module 4 in the longitudinal direction 21.

The outer flange 111 of the first S bend 11 extends at a slight angle to the long direction 21, so that a bus bar 5 inserted into the friction spring 1, especially on the central flange 13, is contacted in electrically conducting fashion. With this, the bus bar 5 is held by a clamp in the first S bend 11, so that it cannot drop out of friction spring 1 in undesired fashion.

The housing 31 of the installed plug-in arrangement 3 exhibits an exterior part 311, which projects out of the electrical module 4. In addition it exhibits an interior part 312, which is placed in an interior space 42 of the electrical module 4. Between the exterior part 311 and the interior part 312, an exterior stop 33 is provided on an exterior side 34 of the housing, which comes to the stopping point on a front side 44 of the electrical module 4 when the plug-in arrangement 3 is inserted into the recess 411 of the component 4, and limits the insertion. When the plug-in arrangement 3 is installed, the exterior stop 33 adjoins the front side 44 of electrical module 4.

On its opposite sides, the plug-in arrangement 3 also exhibits a front side 351, 352. These front sides 351, 352 are configured to be at least partially open, so that the interior space 32 of the plug-in arrangement 3, and thus the leaf spring 1 placed there, is accessible from the front sides 351, 352. In addition, in the exterior part 311 of plug-in arrangement 3, opposite-placed housing walls are configured to be open, so that the bus bar 5 can be inserted in the longitudinal direction 21 into the first S bend 11 of clamping spring 1.

So that the clamping spring 1 on the front side 351 of exterior part 311 cannot be removed or fall out, in the interior space 32 of the housing 31, transverse to the long direction 21, a stop 321 is provided, on which the open end 113 of the first S bend comes to a stop against the long direction 21. Here the stop 321 is formed by an edge of the housing.

When the plug-in arrangement 3 is installed, the second S bend 12 is inserted onto the planar contact plate 43, and extends in the longitudinal direction 21. The outer stop 33 adjoins the front side 44 of the upper housing 41, and the open end 113 of the first S bend 11 adjoins on the stop 321. By this means, the leaf spring 1 is clamped between the stop 321 and contact plate 43. Additionally, on contact plate 43 a counter-locking detent 431 is provided, which acts in concert with a locking recess 131 on the central flange 13 of leaf spring 1, and hold it in its position. This prevents clamping spring 1 from being inserted too far onto contact plate 43. The locking device 131 is here provided as a recess, while the counter-locking device 431 is configured as an integral detent element. Also applicable are other locking and counter-locking devices 131, 431.

To secure the leaf spring 1 in the housing 31 of plug-in arrangement 3, it is also possible as a supplement or alternative to provide attachment devices (not shown) on the housing 31 and if necessary corresponding counter-attachment devices (not shown) on the leaf spring 1.

In the plug-in arrangement 3 depicted, the housing 31 exhibits a gap 313 on the interior part 312. The gap 313 makes it possible to slide it onto the contact plate 43, which is supported on the electronic housing 41 of electrical module 4. In the longitudinal direction 21, roughly in the middle of the leaf spring 1, in the outer flange 111 of the first S bend 11, a first slit 141 is provided. In addition, in the longitudinal direction 21, roughly in the middle of the leaf spring 1, in the outer flange 121 of the second S bend 12 and at least a part of the central flange 13, a second slit 142 is provided. The slits 141, 142 make it possible to insert an intermediate wall 36, so that it is situated on the end 52 of a bus bar 5 or between the ends 52 of two bus bars 5. The intermediate wall 36 is formed of an electrically insulating material or an electrically conducting material. In the housing 33, in the middle, preferably in addition there are guides for the intermediate wall. To increase safety for the user, the bus bars 5 exhibit insulating sheaths 51, which preferably are formed from a heat-shrinkable insulating material. The sheaths 51 are preferably provided at all places where the bus bars 5 do not make electrical contact with the friction spring 1. In addition, the housing 31 of the plug-in arrangement 3 is able to be covered with an electrically insulating housing bracket 37.

In the housing bracket 37, a locking device 371 is provided, here an integral element, which locks with a counter-locking element (not shown), which is provided on the exterior part 311 of the housing 31 of the plug-in arrangement 3. As an alternative, or in addition, it is conceivable that the bracket 37 on the electronic housing 41 of the electrical module 4 be lockable, and/or locking of the leaf spring 1 on the contact plate 43, so that the plug-in arrangement 3 is secured against removal from the contact plate 43.

Figure 1C:
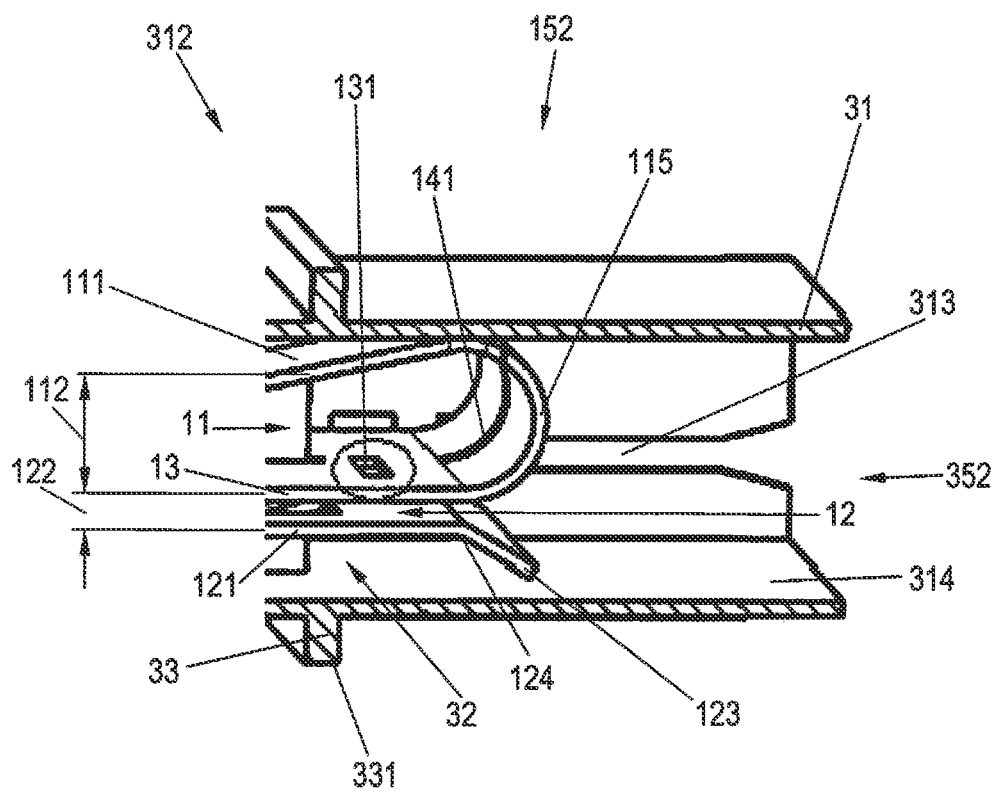

FIG. 1c shows that a distance 112 of the outer flange 111 of the first S bend 11 from the central flange 13 of leaf spring 1 is larger than a distance 122 of the outer flange 121 of the second S bend 12 from the central flange 13. In addition, it is shown that the central flange 12 and the outer flange 121 of the second S bend 12 run roughly parallel to each other and in the longitudinal direction 21, in which the housing 31 of plug-in arrangement 3 is also aligned. This plug-in arrangement 3 is especially suited for electrical modules 4, in which the second S bend 12 is inserted onto flat-shaped contact devices 43, such as for example the depicted contact plate 43, onto a printed circuit board or a contact grid. Due to the relatively large distance 112 of the outer flange 111 of the first S bend 11 from the central flange 13, in addition it is suitable for bus bars 5 with a relatively large cross-section, which are used to transmit high power levels. The electrical module 4 is therefore designed for 380-volt applications or applications with still greater voltages. However, the invention is also suited for electrical modules 4, which are designed for considerably lower voltages, for example for 24-volt applications. In addition, it is suitable for both DC and AC applications.

FIG. 2 shows an electrical module 4 in a sectional view, wherein two plug-in arrangements 3 are provided The plug-in arrangements 3 are also shown in a sectional view, so that in each case their leaf springs 1 are visible. The electrical module 4 is inserted onto a hat-shaped mounting rail 7.

Figure 2C:
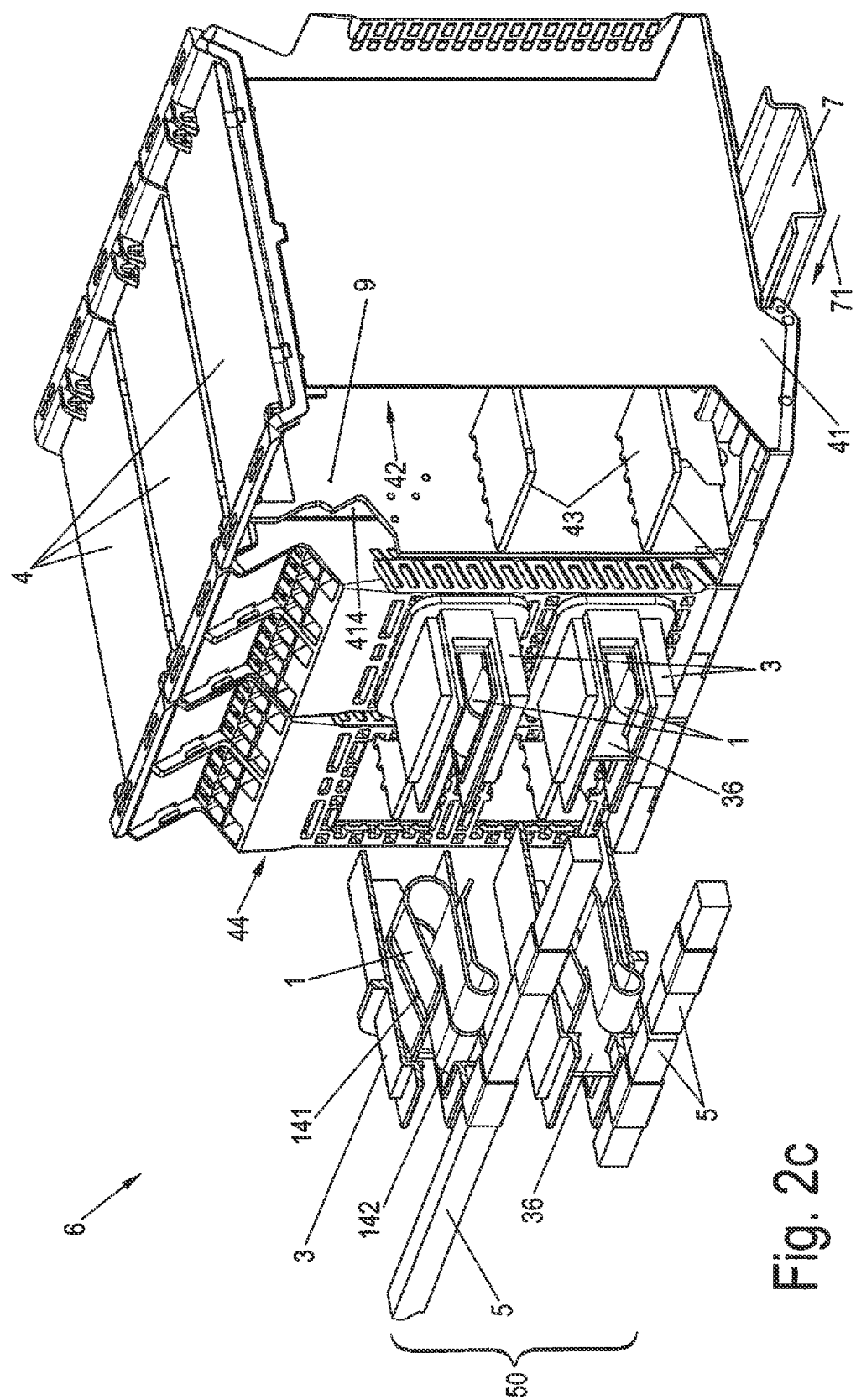

FIGS. 2b and 2c show an electrical module arrangement 6 with multiple electrical modules 4 of FIG. 2a in various stages of assembly. The printed circuit board 9 is placed parallel to a wall 411 of the electronic housing 41. It extends transverse to the lining-up direction 71 and parallel to the longitudinal direction 21. In the present embodiment example, two contact plates 43 per row assembly are provided, which are situated transverse to the printed circuit board 9 and attached to it. On the electrical modules 4 shown here, therefore, two bus bars 5 of the bus system 50 are attachable, via two plug-in arrangements 3, each of which is inserted onto one of the contact plates 43.

It is shown that the contact plate 43 of the plug-in arrangement 3 installed into electrical module 4 engages into the component of the second S bend 12, in which the outer flange 121 of second S bend 12 and the central flange 13 are placed roughly parallel to each other. This arrangement of the contact plate 43 and the plug-in arrangement 3 or friction spring 1 makes it very easy to insert the plug-in arrangement 3 into the electrical module 4, as well as ensuring very secure electrical contact. Also shown is the insertion of a bus bar 5 in the longitudinal direction 21. With this, for one, a longitudinal bus bar 5 is shown, which extends over multiple plug-in arrangements 3. Additionally, the arrangement of multiple short bus bars 5 is shown, which here extend only from one plug-in arrangement 3 to its adjoining plug-in arrangement 3. Between the ends of these bus bars 5, an intermediate wall 36 is inserted into the slits 141, 142 of friction spring 1, which serve for centering a short bus bar between two plug-in arrangements 3 of two adjoining electrical modules 4.

In contrast to the contact devices 43 arranged in FIGS. 2a-2c on the printed circuit board 9, the contact device 43 of FIGS. 2d-2f is configured not only as a contact plate, but also exhibits a support bend 432, with two opposite legs 4321 on the open ends of which soldering lugs 435 are provided. The soldering lugs 435 can be inserted through the recesses in the printed circuit board 9, so that they are able to be soldered onto the back side 91 of the printed circuit board 9. By this means, the current-transmission capability and the stability of contact device 43 are increased, and when the plug-in arrangement 3 is inserted onto, or the plug-in arrangement 43 is loosened from, the contact device 43, the danger that the contact device 43 will become loose from the printed circuit board 9, is reduced. By this means it is also possible that the second S bend 12 exhibits a larger contact force.

In the embodiment shown here, for attachment of the plug-in arrangement 3 onto contact device 43, a mechanical locking device is provided as an attachment device, which is placed on the housing 31 of plug-in arrangement 3. In the description of FIGS. 2d-2g, the terms attachment device 38 and mechanical locking device are therefore used synonymously.

The mechanical locking device 38 comprises an operating device 381, which here can be operated by an operating tool 22, such as a screwdriver, as well as a locking edge 382. Here the operating tool 22 is able to be inserted through a tool opening 315 in the housing 31 of plug-in arrangement 3 in the insertion direction 21, into it. By operating the operating device 381 with the operating tool 22, the locking edge 382 is adjustable in a loosening direction 71, which here corresponds to the lining-up direction 71.

The contact device 43 of this embodiment form includes ramps 434 on a side turned toward the plug-in arrangement 3, which facilitates insertion of the plug-in arrangement 3 onto the contact device 43. In addition, the contact device 43 exhibits at least one counter-locking edge 433, which acts in concert with the locking edge 382 of the housing 31 of plug-in arrangement 3. FIG. 2d illustrates the contact device 43 soldered onto the printed circuit board 9, with support bend 432.

FIG. 2e shows the insertion of the plug-in arrangement onto the contact device 43; FIG. 2f shows the plug-in arrangement 3 locked onto the contact device 43 during insertion of an operating tool 22 into the plug-in arrangement 3; and FIG. 2g shows the loosening and sliding back of the plug-in arrangement 3 from contact device 43. The plug-in arrangement 3 is depicted in a sectional view, so that leaf spring 1 is visible. In addition, printed circuit board 9, for the sake of better visibility, is not depicted in these figures.

The locking edge 382 of mechanical locking device 38 is configured to be ramp-shaped on the side of it facing contact device 43. When the plug-in arrangement 3 is inserted in the insertion direction 21 onto contact device 43, the locking edge 382 is therefore shifted in the loosening direction 71, so that the first S bend 11 of friction spring 1 is able to be inserted onto contact device 43, until locking edge 382 of mechanical locking device 38 and the counter-locking edge 433 of contact device 43 lock with each other.

Here it is possible to loosen plug-in arrangement 3 from contact device 43 by operating the operating device 381 with operating tool 22, through which locking edge 382 of mechanical locking device 38 is also shifted into the loosening direction 71, so that the engagement of locking edge 382 with counter-locking edge 433 is unlocked, and the plug-in arrangement 3 is able to be slid back in a direction counter to insertion 211 against the insertion direction 21.

Figure 3A:
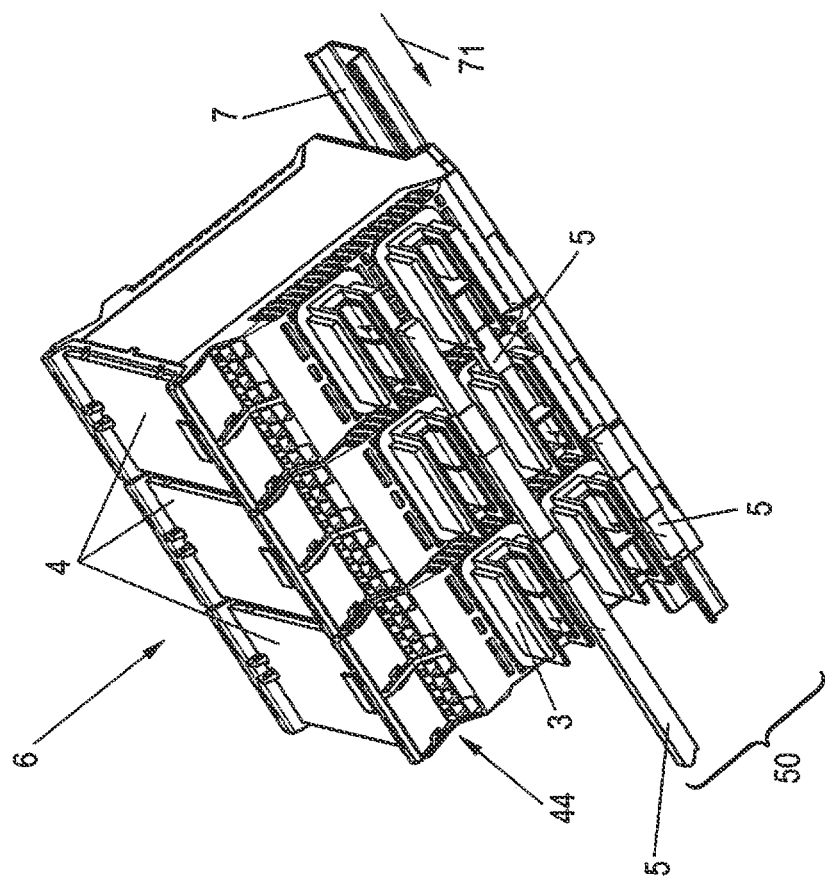
FIGS. 3a and 3b are front perspective views illustrating the manner of connecting bus bars to a plurality of rail-mounted modules.
Figure 3B:
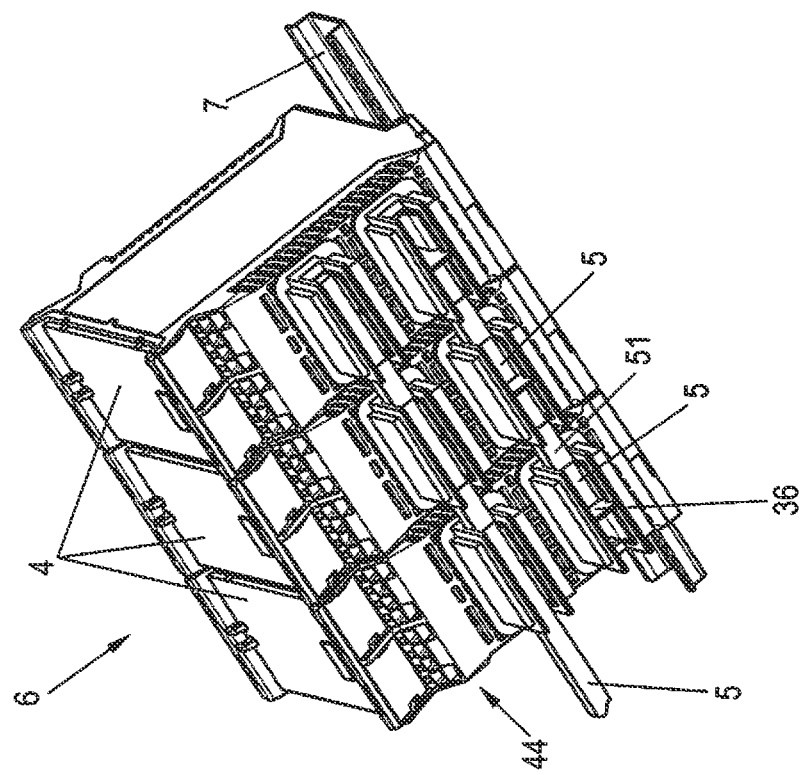

In FIGS. 3a and 3b, the electrical modules 4 of electrical module arrangement 6 are fully installed. The insertion of the bus bars 5 into the plug-in arrangements 3 is depicted.

FIG. 4 shows, for a further development, but also a separate invention, an especially advantageous wall mounting of such an electrical module arrangement 6. The electrical modules 4 are not mounted here on a mounting rail 7, but rather on a wall. On the wall 8, here wall rails 81 are provided, on which mounting elements, such as, preferably, (elongated, profile-shaped) housing brackets 37 are attached. Alternately, it is also possible to mount the housing bracket 37 directly onto wall 8. The bus bars 5 in this arrangement are attached on housing brackets 37 pre-mounted on the wall 8. Then the electrical modules 4, in which the plug-in arrangements 3 are pre-mounted, are inserted.

It is very easy to quickly assemble the electrical module arrangement 6. Because the contact plate 43 soldered onto the printed circuit board 9 is pre-mounted together with the printed circuit board 9 in electrical module 4. Such mounting is possible without making contact with the walls 411 of electronic housing 41. The leaf spring 1 that here is S shaped, is likewise pre-mounted in the housing 31 of plug-in arrangement 3, and is pushed from without through the recess 411 provided here in the front side 44 of the electronic housing, onto contact plate 43, and locked.

The bus bar 5 is able to be inserted from without into the plug-in arrangement 3, or one or more electrical modules 4 are able to be inserted onto the bus bar 5 or the bus system 50. The bus bars 5 can be provided with an insulation sleeve 51, to protect a user from making electrical contact. The insulation sleeve 51 is useful at the same time for attachment in the housing bracket 37.

FIG. 5 illustrates a version in which the leaf spring 1' is not configured as an S, but rather is W-shaped. It is manufactured from a conducting sheet material. By this means it is configured to have spring action and exhibits a resetting force. It is manufactured as a stamped bending component in a single piece, and therefore is produced in a very cost-effective manner. This leaf spring 1' as a contact element, exhibits three tulip-shaped receptacles 1001, 1002, 1003. Of these, two tulip receptacles 1001, 1003 are accessible from a first direction A, while the third receptacle 1002 is accessible from a second direction 72 placed opposite the first direction B. The tulip receptacle 1002 accessible from the second direction B, is placed between the two tulip receptacles 1001, 1003 accessible from the first direction A.

The tulip receptacles 1001, 1002, 1003 are provided to admit electrical connection elements. With this, it is preferred that the two tulip receptacles 1001, 1003, accessible from the first direction A be provided to admit bus bars 5001, 5002 (especially a joint potential) as electrical connection elements, which preferably are advantageously mounted on a wall (FIG. 5). The tulip receptacle accessible from the second direction B is preferably provided to admit an electrical connection element (not able to be made out here), which connect bus bars 5001, 5002 with an electrical assembly of an electrical device (see FIG. 5), especially an electrical module 4000. This electrical connection element is preferably configured as a plug connection.

Referring again to FIGS. 1 to 4, the second S bend 12 in FIG. 1 can be replaced by tulip receptacle 1002, and otherwise correspond to the design of electrical module 4 from FIGS. 1 to 4. According to FIG. 5, a contact element is created, which makes available two tulip receptacles to admit the connecting elements preferably of the bus system, especially bus bars. Thus either more attachment elements of the bus system can be connected to the contact element, or one tulip receptacle is provided to admit one connection element, especially to admit one end of a bus bar, so that, for contact of the connection element, a large contact area is available, through which more contact points become possible and the contact element is especially well suited for power currents. A corrugated surface, and/or extra spring capacity in the area of the contact points can further enhance the contacting.

While in accordance with the provisions of the Patent Statutes the preferred forms and embodiments of the invention have been illustrated and described, it will be apparent to those skilled in the art that changes may be made without deviating from the invention described above.

What is claimed is:

1. An electrical module assembly, comprising:
   (a) a fixed support (7; 8);
   (b) a plurality of electrical modules (4) mounted in side-by-side relation on said support, each of said modules including:
      (1) a rectangular module housing (41) having horizontal bottom and top walls, a pair of vertical opposed side walls, and vertical front and rear end walls, said walls cooperating to define that cooperate to define an internal chamber (42), one of said end walls containing a generally-rectangular access opening (411); and
      (2) at least one vertical planar printed circuit board (9) mounted in said chamber in spaced parallel relation between said side walls, said printed circuit board having a planar horizontal contact (43) extending orthogonally from one side thereof adjacent said access opening;
   (c) horizontal linear bus bar means (5) arranged externally of said module housing, said bus bar means extending normal to the longitudinal axis of said module housing; and
   (d) plug-in connector means (3) electrically connecting said bus bar means with said printed circuit board, including:
      (1) a generally-rectangular spring housing (31) mounted in said access opening, said spring housing having horizontal top and bottom walls and vertical parallel spaced opposed side walls, said spring housing walls cooperating to define a longitudinal through passage, said spring housing having a first end extending into said chamber via said module housing access opening, and a second end arranged outside said module housing; and
      (2) an electrically-conductive resilient leaf spring (1) mounted in said spring housing through passage, said leaf spring having intermediate its ends:
         (a) at least two vertically-arranged oppositely-directed upper and lower tulip-shaped bent portions (11, 12) connected by a horizontal central leg portion (13),
         (b) a horizontal top leg portion (111) connected at one end with said upper bent portion, and
         (c) a horizontal bottom leg portion (121) connected at one end with said lower bent portion, said upper and lower leg portions extending in spaced vertical relation above and below said central leg portion, whereby said upper and central leg portions cooperate to define an upper receiving space (11; 1001), and said central and lower leg portions cooperate to define a lower receiving space (12; 1002), such that said leaf spring has a generally S-shaped configuration;
      (3) said leaf spring housing side walls at said first end containing opposed horizontal first slots (313) for receiving said printed circuit board contact during the insertion thereof into one of said receiving space when said plug-in unit is inserted into said module housing access opening;
      (4) said leaf spring housing side walls at said second end containing at least one second slot for receiving said bus bar means during the insertion thereof into the other of said receiving spaces.

2. The electrical module assembly as defined in claim 1, wherein said upper receiving space receives said bus bar means, and said lower receiving space receives said printed circuit board contact.

3. The electrical module assembly as defined in claim 2, wherein said leaf spring includes a vertically-arranged third bend and associated leg portions for defining below said lower receiving space a lowermost third receiving space (1003) arranged externally of said module housing, whereby said leaf spring has a generally W-shaped configuration adapted to connect said printed circuit board contact with two parallel vertically-spaced horizontal bus bar means (5001, 5002).

4. The electrical module assembly as defined in claim 1, and further including locking means (131, 431) 1 for fastening said leaf spring to said printed circuit board contact.

5. The electrical module assembly as defined in claim 1, and further including external stop means (33) arranged on the external surface of said spring housing for limiting the extent of insertion of said spring housing first end into said module housing chamber.

6. The electrical module assembly as defined in claim 1, wherein said spring housing longitudinal passage is provided with internal stop means (321) for preventing outward longitudinal displacement of said leaf spring in the direction of said spring housing second end.

7. The electrical module assembly as defined in claim 1, and further including a protective cover member (37) formed of insulating material, said cover member being removably mounted about said spring housing second end.

8. The electrical module assembly as defined in claim 1, and further including a vertical planar divider wall (36) formed of insulating material arranged longitudinally in said spring housing longitudinal passage at said spring housing second end, said divider wall extending into a corresponding slit (142) contained in said spring lower bend portion and said upper, central and lower leg portions.

9. The electrical module assembly as defined in claim 1, wherein said fixed support is a generally U-shaped mounting rail (7) upon which said module housings are mounted.

10. The electrical module assembly as defined in claim 1, wherein said fixed support comprises a vertical wall (8) upon which said horizontal bus bar means is mounted, said modules being supported on the wall by the cooperation between the leaf springs of said modules and said bus bar means.

11. The electrical module assembly as defined in claim 10, wherein each of said modules includes two of said plug-in connector means mounted in vertically-spaced openings contained in said housing end wall, said connector means being connected with separate contacts of said printed circuit board, respectively; and further wherein said bus bar means includes two vertically-spaced parallel horizontal bus bars to which said connector means are connected, respectively.

12. An electrical module assembly, comprising:
   (a) a plurality of horizontal linear bus bar means (5);
   (b) support means (81, 37, 372) respectively supporting said bus bar means in horizontal parallel spaced exposed relation on a fixed vertical wall (8);
   (c) a plural of electrical modules (4) mounted in side-by-side relation on said bus bar means, each of said modules including:
      (1) a rectangular module housing (41) having horizontal bottom and top walls, a pair of vertical opposed side walls, and vertical front and rear end walls, said walls cooperating to define that cooperate to define an internal chamber (42), one of said end walls containing an access opening (411); and
      (2) at least one vertical planar printed circuit board (9) mounted in said chamber in spaced parallel relation between said side walls, said printed circuit board having a planar horizontal contact (43) extending orthogonally from one side thereof adjacent said access opening; and
   (c) plug-in connector means (3) electrically connecting said bus bar means with said printed circuit board, including:
      (1) a generally-rectangular spring housing (31) mounted in said access opening, said spring housing having horizontal top and bottom walls and vertical parallel spaced opposed side walls, said spring housing walls cooperating to define a longitudinal through passage, said spring housing having a first end extending into said chamber via said module housing access opening, and a second end arranged outside said module housing; and
      (2) an electrically conductive resilient leaf spring (1) mounted in said spring housing through passage, said leaf spring having intermediate its ends:
         (a) at least two vertically-arranged oppositely-directed upper and lower tulip-shaped bent portions (11, 12) connected by a horizontal central leg portion (13),
         (b) a horizontal top leg portion (111) connected at one end with said upper bent portion, and
         (c) a horizontal bottom leg portion (121) connected at one end with said lower bent portion, said upper and lower leg portions extending in spaced vertical relation above and below said central leg portion, whereby said upper and central leg portions cooperate to define an upper receiving space (11; 1001), and said central and lower leg portions cooperate to define a lower receiving space (12; 1002), such that said leaf spring has a generally S-shaped configuration;
         (3) said leaf spring housing side walls at said first end containing opposed horizontal first slots (313) for receiving said printed circuit board contact during the insertion thereof into one of said receiving space when said plug-in unit is inserted into said module housing access opening;
         (4) said leaf spring housing side walls at said second end containing second slots for receiving said bus bar means during the insertion thereof into the other of said receiving spaces.

13. The electrical module assembly as defined in claim 12, wherein said support means includes:
   (1) a plurality of vertical support rails (81) mounted in spaced relation on a fixed wall (8);
   (2) a plurality of horizontal support rails (37) mounted in vertically spaced relation on said vertical rails; and
   (3) a plurality of brackets (372) mounting a plurality of horizontal bus bars in exposed relation on said horizontal support rails, respectively.

14. The electrical module as defined in claim 13, wherein said leaf spring includes a vertically-arranged third bend and associated leg portions for defining below said lower receiving space a lowermost third receiving space (1003) arranged externally of said module housing, whereby said leaf spring has a generally W-shaped configuration adapted to connect said printed circuit board contact with two parallel vertically-spaced horizontal bus bar means (5001, 5002).

* * * * *